United States Patent
Li et al.

(10) Patent No.: US 12,002,877 B2
(45) Date of Patent: Jun. 4, 2024

(54) FIELD EFFECT TRANSISTORS INCLUDING QUANTUM LAYERS

(71) Applicant: The Research Foundation for the State University of New York, Albany, NY (US)

(72) Inventors: Huamin Li, Buffalo, NY (US); Fei Yao, Buffalo, NY (US)

(73) Assignee: The Research Foundation for the State University of New York, Albany, NY (US)

( * ) Notice: Subject to any disclaimer, the term of this patent is extended or adjusted under 35 U.S.C. 154(b) by 0 days.

(21) Appl. No.: 17/358,500

(22) Filed: Jun. 25, 2021

(65) Prior Publication Data
US 2021/0408272 A1 Dec. 30, 2021

Related U.S. Application Data

(60) Provisional application No. 63/044,595, filed on Jun. 26, 2020.

(51) Int. Cl.
*H01L 29/775* (2006.01)
*H01L 29/417* (2006.01)
*H01L 29/423* (2006.01)

(52) U.S. Cl.
CPC ...... *H01L 29/775* (2013.01); *H01L 29/41733* (2013.01); *H01L 29/42384* (2013.01)

(58) Field of Classification Search
None
See application file for complete search history.

(56) References Cited

U.S. PATENT DOCUMENTS

| 2015/0194619 A1* | 7/2015 | Franklin | H01L 51/0558 257/29 |
| 2021/0057558 A1* | 2/2021 | Pritchard | H01L 29/78681 |

* cited by examiner

*Primary Examiner* — Mohammad A Rahman
(74) *Attorney, Agent, or Firm* — Lance D. Reich; Peter Fallon

(57) ABSTRACT

Field effect transistors (FET) including quantum layers. A FET may include a substrate, and an oxide layer disposed over the substrate. The oxide layer may include a first section and a second section positioned adjacent the first section. The FET may also include a first quantum layer disposed over the first section of the oxide layer, and a second quantum layer disposed over the second section of the oxide layer, and a first segment of the first quantum layer. Additionally, the FET may include a drain region disposed directly over a second segment the first quantum layer. The second segment of the first quantum layer may be positioned adjacent the first segment of the first quantum layer. The FET may further include a source region disposed over the second quantum layer, and a channel region formed over the second quantum layer, between the drain region and the source region.

14 Claims, 23 Drawing Sheets

FIELD EFFECT TRANSISTORS INCLUDING QUANTUM LAYERS

CROSS-REFERENCE TO RELATED APPLICATIONS

This application claims priority to U.S. provisional application No. 63/044,595 filed on Jun. 26, 2020, the content of which is hereby incorporated by reference into the present application.

GOVERNMENT RIGHTS

This invention was made with government support under grant no. ECCS1944095 awarded by the National Science Foundation. The government has certain rights in the invention.

BACKGROUND

The disclosure relates generally to semiconductor devices, and more particularly, to field effect transistors including at least one quantum layer formed therein.

As the miniaturization of complementary metal-oxide-semiconductor (CMOS) approaches to the physical limitation (~5 nm node), new technologies are critically required to extend the performance of electronic systems in terms of power, speed, and density etc. For example, conventional electronic switching devices such as a MOSFET operate on the basis of thermionic emission of charge carriers flowing from a normal source over a potential barrier ($\phi B$) within channel region. Due to the energy (E) dependence of the density of states (DOS) in three-dimensional (3D) bulky crystals (i.e., DOS~$(E-EC)^{1/2}$ where EC is the energy at the conduction band edge), the electrons density (n) in the normal source follows the Fermi-Dirac distribution with the sub-exponential decay of a relatively long Boltzmann tail. As a result, a current-voltage (I-V) relation can be calculated as I~$\exp(qV/kBT)$, where I is the current, q is the electronic charge, V is the voltage, T is the temperature, and kB is the Boltzmann constant. This sets a fundamental limit of the steepness of the transition slope from the off to the on state, known as subthreshold swing (SS), defined as SS=$\partial VG/\partial(\log 10ID)$=~$(kBT/q)\cdot\ln 10$~60 mV of gate voltage to change the current by one order of magnitude at room temperature. Here VG is the gate voltage, and ID is the drain current. This SS limit, or thermal limit, sets a bottleneck of the minimum power dissipation. Therefore, to increase the turn-on steepness and enable the voltage supply (VDD) lowering without performance loss, various types of steep-slope device have been proposed, including the tunneling transistors (TFETs) based on quantum-mechanical tunneling effect and the negative capacitance transistors (NCFETs) based on ferroelectric negative differential capacitance. These solutions in principle can achieve sub-60-mV/decade SS, for example, by lowering the transport factor via a band-to-band Zener tunneling current in TFETs, or by lowering the body factor via a ferroelectric gate layer in NCFETs. However, they still have their own challenges and issues for the practical application, and none of they can meet all the following requirement to outperform the current CMOS technology: (i) the on-state current density is up to hundreds of $\mu A/\mu m$; (ii) the average SS value below 60 mV/decade sustains at least 4-5 decades of the drain current; (iii) the on/off ratio is at east $10^5$; and (iv) the VDD value is less than 0.5 V. Therefore, there is a vital requirement to develop new steep-slope switching devices with new physical principles to continue the performance and power improvement of nanoelectronics.

BRIEF DESCRIPTION

A first aspect of the disclosure provides a field effect transistor, including: a substrate; an oxide layer disposed over the substrate, the oxide layer including a first section and a second section distinct from and positioned adjacent the first section; a first quantum layer disposed over the first section of the oxide layer; a second quantum layer disposed over: the second section of the oxide layer, and a first segment of the first quantum layer; a drain region disposed directly over a second segment the first quantum layer, the second segment of the first quantum layer positioned adjacent the first segment of the first quantum layer; a source region disposed over the second quantum layer, opposite the drain region; and a channel region formed over the second quantum layer, between the drain region and the source region.

A second aspect of the disclosure provides field effect transistor, including: a substrate; an oxide layer disposed at least partially over the substrate; a quantum layer disposed over: the oxide layer, and the substrate, adjacent the oxide layer; a drain region disposed directly over the substrate adjacent the quantum layer; a source region disposed over the quantum layer, opposite the drain region; and a channel region formed over the quantum layer, between the drain region and the source region.

A third aspect of the disclosure provides field effect transistor, including: a substrate including: a first section, a second section distinct from and positioned opposite the first section, and an intermediate section formed between the first section and the second section; a first oxide layer disposed over the first section of the substrate; a second oxide layer disposed over the second section of the substrate; a first quantum layer disposed over: the first oxide layer, and at least a portion of the intermediate section of the substrate, adjacent the first oxide layer; a second quantum layer disposed over: the second oxide layer, and at least a distinct portion of the intermediate section of the substrate, adjacent the second oxide layer; a drain region disposed directly over the second quantum layer; a source region disposed directly over the first quantum layer, opposite the drain region; and a channel region formed over the first quantum layer and the second quantum layer, between the drain region and the source region.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

As an initial matter, in order to clearly describe the current disclosure it will become necessary to select certain terminology when referring to and describing relevant components within the disclosure. When doing this, if possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms. What may be described herein as being a single part may include and be referenced in another context as consisting of multiple components. Alternatively, what may be described herein as including multiple components may be referred to elsewhere as a single part.

The disclosure relates generally to semiconductor devices, and more particularly, to field effect transistors including at least one quantum layer formed therein.

These and other embodiments are discussed below with reference to FIGS. 1-23. However, those skilled in the art will readily appreciate that the detailed description given herein with respect to these Figures is for explanatory purposes only and should not be construed as limiting.

Figure 1:
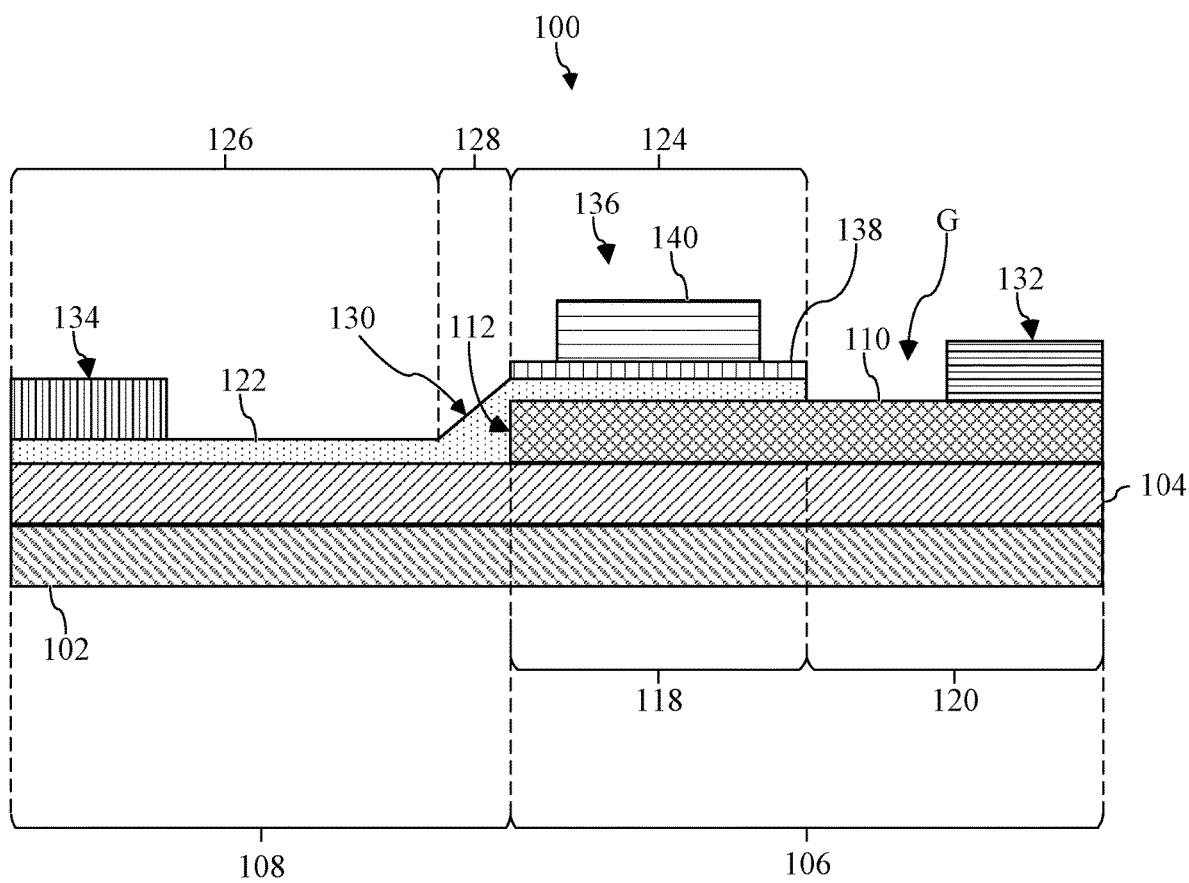
FIG. 1 shows a cross-sectional front view of a field effect transistor including two distinct quantum layers, according to embodiments of the disclosure.

Turning to FIG. 1, a cross-sectional front view of a field effect transistor 100 (hereafter, "FET 100") is shown. In the non-limiting example, FET 100 may include substrate layer 102. Substrate layer 102 may form the base layer for FET 100. Additionally, substrate layer 102 may also form a back gate in FET 100. Substrate 102 may be formed as a semiconducting material and/or may be formed from any suitable material or material composition that includes semiconducting properties/characteristic. For example, substrate layer 102 may be formed from indium phosphide (InP) or Indium gallium arsenide (InGaAs). In other non-limiting examples substrate layer 102 can include without limitation, substances consisting essentially of one or more compound semiconductors. Substrate layer 102 can be provided as a bulk substrate or as part of a silicon-on-insulator (SOI) wafer. Additionally, or alternatively, substrate layer 102 may be formed from, for example, silicon (Si), silicon carbide (SiC), germanium (Ge), germanium oxide (GeO), cadmium zinc telluride (CdZnTe), or gallium arsenide (GaAs). Furthermore, substrate layer 102 may be fabricated as a layer of semiconductor material, substances or materials consisting essentially of one or more compound semiconductors having a composition defined by the formula AlX1GaX2InX3AsY1PY2NY3SbY4, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition ZnA1CdA2SeB1TeB2, where A1, A2, B1, and B2 are relative proportions each greater than or equal to zero and A1+A2+B1+B2=1 (1 being a total mole quantity).

Additionally, components, portions, and/or layers of FET 100 may be formed on and/or over substrate 102. For example, and as shown in FIG. 1, an insulator or oxide layer 104 (hereafter, "oxide layer 104") may be formed over an upper surface of substrate 102. More specifically, oxide layer 104 may be disposed directly over, positioned on, and/or may substantially cover substrate 102 of FET 100. In the non-limiting example, oxide layer 104 may include a first section 106 and a distinct, second section 108. Second section 108 may be distinct from and positioned or formed adjacent first section 106. As shown, first section 106 and second section 108 may be integrally formed and/or may each be a distinct portion or section of a single, unitary layer forming oxide layer 104. That is, distinct sections 106, 108 may be part of the single, unitary layer that is oxide layer 104 of FET 100.

Oxide layer 104 may be formed over substrate using any suitable material deposition and/or layer formation techniques or processes, as discussed herein. In non-limiting example oxide layer 104 may be formed as a bulk silicon insulator or can be composed of an oxide substance. Materials appropriate for the composition of oxide layer 104 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide (ErOx), ($Al_2O_3$), ($Si_3N_4$), (2D h-BN), ionic liquids, electric double layers, and other currently known or later developed materials having similar properties.

FET 100 may also include a first quantum layer 110 disposed over oxide layer 104. As shown in FIG. 1, first quantum layer 110 may be disposed directly over, positioned on, contact, and/or may substantially cover at least a portion of oxide layer 104 of FET 100. In the non-limiting example, first quantum layer 110 may only be disposed over first section 106 of oxide layer 104. As a result, and as discussed herein, first quantum layer 110 may also form or include an end wall 112 that is positioned within FET 100. First quantum layer 110 may include a first segment 118 and a second segment 120. Second segment 120 may be distinct from and positioned or formed adjacent first segment 118. As shown in FIG. 1, first segment 118 and second segment 120 may be integrally formed and/or may each be a distinct segment or portion of a single, unitary layer forming first quantum layer 110. That is, distinct segments 118, 120 may be part of the single, unitary layer that is first quantum layer 110 of FET 100. In a non-limiting example, first quantum layer 110 may be formed from molybdenum disulfide ($MoS_2$). In other non-limiting examples, first quantum layer 110 may be formed from any suitable semiconducting material(s) or semiconductor(s) including, but not limited to, one-dimensional (1D) carbon nanotubes; two-dimensional (2D) transition metal dichalcogenides, monochalcogenides, black phosphorous, silicene, and germanene etc.; three-dimensional (3D) silicon, germanium, silicon carbide, etc. First quantum layer 110 may be formed in FET 100 using any suitable material deposition and/or layer formation techniques or processes, as discussed herein.

In the non-limiting example shown in FIG. 1, FET 100 may also include a second quantum layer 122. Second quantum layer 122 may be disposed over oxide layer 104 and at least a portion of first quantum layer 110, respectively. More specifically, second quantum layer 122 may include a plurality of distinct portions that may be disposed over, positioned on, contact, and/or may substantially cover second section 108 of oxide layer 104 and/or a portion of first segment 118 of first quantum layer 110. For example, second quantum layer 122 may include a first portion 124 disposed directly over, positioned on, contact, and/or substantially cover first segment 118 of first quantum layer 110. Second quantum layer 122 may also include a second portion 126 disposed directly over, positioned on, contacting, and/or substantially cover (most of) second section 108 of oxide layer 104. As shown, second portion 126 of second quantum layer 122 may be formed and/or positioned opposite first portion 124. Second quantum layer 122 may also include an intermediate portion 128 formed and/or positioned between first portion 124 and second portion 126. In the non-limiting example shown in FIG. 1, intermediate portion 128 may contact, be disposed directly over, positioned on, and/or substantially cover (some of) second section 108 of oxide layer 104 not covered by second portion 126 of second quantum layer 122. Additionally, intermediate portion 128 may contact, be disposed directly over, positioned on, and/or substantially cover end wall 112 of first quantum layer 110. In the non-limiting example, intermediate portion 128 may include an angled, upper surface 130 that may extend between the upper surface of first portion 124 and second portion 126. Angled surface 130 (and corresponding angled body) of intermediate portion 128 may be formed in FET 100 in order to make second quantum layer 122 a continuous, single, unitary layer that covers at least a portion of oxide layer 104 and first quantum layer 110, as discussed herein. In other non-limiting examples, intermediate portion 126 may be a stepped (e.g., 90° angle) formed between first portion 124 and second portion 126. As shown in FIG. 1, first portion 124, second portion 126, and intermediate portion 128 may be integrally formed and/or may each be a distinct segment or portion of a single, unitary layer forming second quantum layer 122. First quantum layer 110 and second quantum layer 122 may form a heterostructure within FET 100.

In a non-limiting example, second quantum layer 122 may be formed from graphene (Gr). The graphene forming second quantum layer 122 may be formed as either monolayer graphene, few-layer, or multilayer graphene. In other non-limiting examples, second quantum layer 122 may be formed from any suitable semiconducting material(s) or semiconductor(s) including, but not limited to, one-dimensional (1D) carbon nanotubes; two-dimensional (2D) transition metal dichalcogenides, monochalcogenides, black phosphorous, silicene, and germanene etc.; three-dimensional (3D) silicon, germanium, silicon carbide, etc. Second quantum layer 122 may be formed in FET 100 using any suitable material deposition and/or layer formation techniques or processes, as discussed herein.

FET 100 may also include a drain region 132, a source region 134, and a channel region 136. Drain region 132 disposed directly over, positioned on, contact, and/or substantially cover at least a portion of second segment 120 first quantum layer 110. Additionally, drain region 132 may be positioned adjacent to and separated from first portion 124 of second quantum layer 122 to form a gap (G). It is understood that gap (G) may be filled with additional material in further processing and/or during the formation of FET 100, as discussed herein. Source region 134 may be positioned and/or formed opposite drain region 132 within FET 100, and may be disposed over second quantum layer 122. More specifically, source region 134 may be disposed directly over, positioned on, contact, and/or substantially cover (some of) second portion 126 of second quantum layer 122. Channel region 136 of FET 100 may be formed and/or positioned between drain region 132 and source region 134. In the non-limiting example, channel region 136 may be formed, positioned, and/or disposed over second quantum layer 122. More specifically, channel region 136 may be disposed directly over, positioned on, contact, and/or substantially cover first portion 124 of second quantum layer 122. Additionally, channel region 136 may be formed or positioned above, and may be substantially aligned with first segment 118 of first quantum layer 110. Channel region 136 may include a dielectric or insulator layer 138 disposed directly over first portion 124 of second quantum layer 122, and a top gate 140 disposed directly over insulator layer 138.

In non-limiting example, insulator layer 138 of channel region 136 may be formed from alumina (Al2O3). In other non-limiting examples, insulator layer 138 may be formed from silicon dioxide (SiO2), silicon nitride (SiN), hafnium oxide (HfO2), alumina (Al2O3), yttrium oxide (Y2O3), tantalum oxide (Ta2O5), titanium dioxide (TiO2), praseodymium oxide (Pr2O3), zirconium oxide (ZrO2), erbium oxide (ErOx), (Al2O3), (Si3N4), (2D h-BN), ionic liquids, electric double layers, and other currently known or later developed materials having similar properties (e.g., high-k dielectric materials). Furthermore, drain region 132, source region 134, and top gate 140 of channel region 136 may be formed from any suitable conductive material including, but not limited to, 3D metals, 2D graphene (or graphite), other 2D semimetals, or other currently known or later developed materials having similar conductivity properties or characteristics. Drain region 132, source region 134, and channel region 136 may be formed in FET 100 using any suitable material deposition and/or layer formation techniques or processes, as discussed herein.

Figure 2:
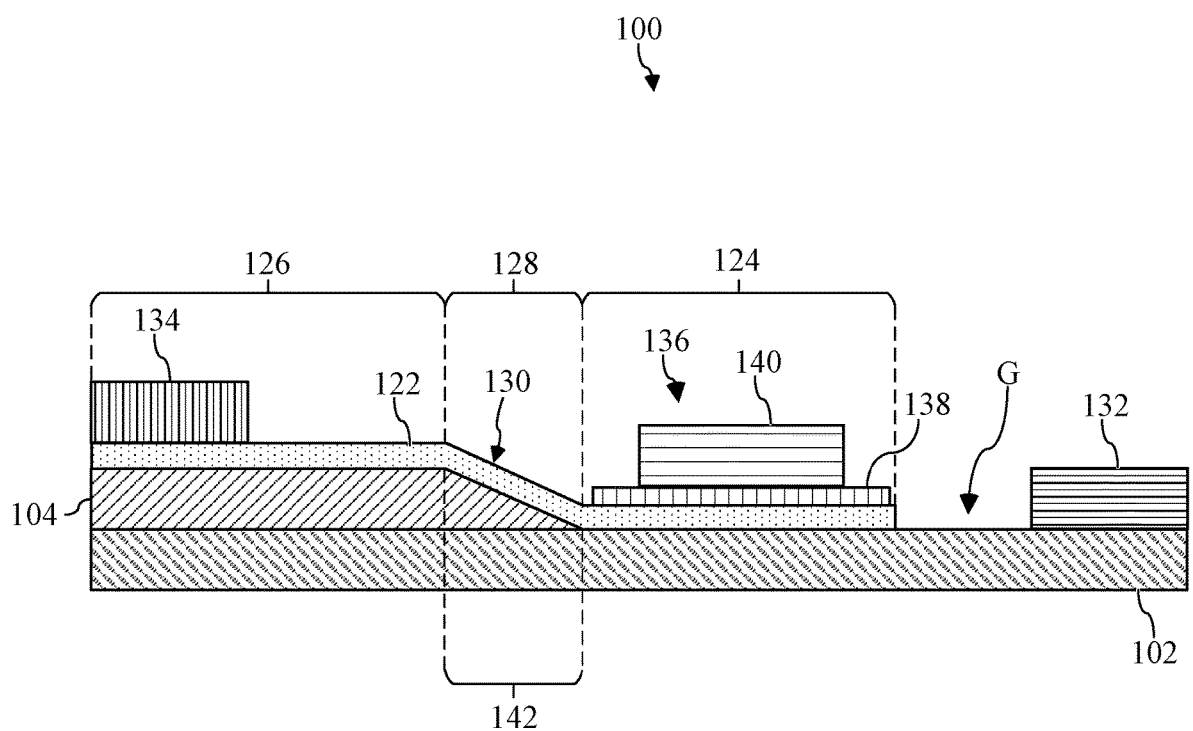
FIG. 2 shows a cross-sectional front view of a field effect transistor including a single quantum layer, according to embodiments of the disclosure.

Turning to FIG. 2, another non-limiting example of FET 100 is shown. It is understood that similarly named components and/or similarly numbered components may function in a substantially similar fashion, may include similar materials/components, and/or may include similar interactions with other components. Redundant explanation of these components has been omitted for clarity.

In the non-limiting example shown in FIG. 2, oxide layer 104 may only be disposed at least partially over substrate 102 of FET 100. That is, and distinct from the non-limiting example shown in FIG. 1, oxide layer 104 may not cover the entirety of substrate 102, but rather may be disposed directly over, positioned on, contact, and/or may substantially cover a portion of substrate 102. Additionally as shown in FIG. 2, oxide layer 104 may include an angled section 142. Angled section 142 of oxide layer 104 may slope downward toward and/or may extend from an upper surface of oxide layer 104 toward substrate 102. In the non-limiting example, channel region 136 may be formed adjacent to and offset from oxide layer 104, and more specifically angled section 142. In other non-limiting examples (see, FIGS. 4 and 5) oxide layer 104 may include a side wall similar to end wall 112 of first quantum layer 110 in FIG. 1 that may be substantially perpendicular to the upper surface of substrate 102.

As shown in FIG. 2, FET 100 may also include a quantum layer 122. Quantum layer 122 of FIG. 2 may be substantially similar as second quantum layer 122 shown and discussed herein with respect to FIG. 1 (e.g., formed from graphene). Quantum layer 122 may be disposed over oxide layer 104 and at least a portion of substrate 102, adjacent oxide layer 104. More specifically, first portion 124 of quantum layer 122 may be disposed directly over, positioned on, contact, and/or may substantially cover a portion of substrate 102 that is formed and/or positioned adjacent to, but not covered by, oxide layer 104. Additionally, first portion 124 of quantum layer 122 may not extend to and/or may not contact drain region 132 of FET 100 disposed directly over, positioned on, contacting, and/or substantially covering at least a portion of substrate 102. As such, region 132 may be positioned adjacent to and separated from first portion 124 of second quantum layer 122 to form a gap (G). It is understood that gap (G) may be filled with additional material in further processing and/or during the formation of FET 100, as discussed herein. As shown in FIG. 2, channel region 136 may be formed or positioned directly over first portion 124 of quantum layer 122. For example, insulator layer 138 of channel region may be disposed directly over, positioned on, contact, and/or may substantially cover first portion 124 of quantum layer 122.

Quantum layer 122 of FET 100 may also include second portion 126. Second portion 126 may be formed opposite first portion 124 and may be disposed directly over at least a portion of oxide layer 104. In the non-limiting example shown in FIG. 2, second portion 126 of quantum layer 122 may be disposed directly over, positioned on, contact, and/or may substantially cover the planar portion (e.g., excluding angled section 142) of oxide layer 104. Source region 134 of FET 100 may be disposed directly over, positioned on, contact, and/or may substantially cover second portion 126 of quantum layer 122.

In the non-limiting example shown in FIG. 2, quantum layer 122 may also include intermediate portion 128. Intermediate portion 128 may be formed and/or positioned between first portion 124 and second portion 126. Similar to the non-limiting example discussed herein with respect to FIG. 1, intermediate portion 128 may include angled, upper surface 130 that may extend between the upper surface of first portion 124 and second portion 126. Angled surface 130 (and corresponding angled body) of intermediate portion 128 may be formed in FET 100 in order to make quantum layer 122 a continuous, single, unitary layer that covers oxide layer 104 and a portion of substrate 102, as discussed herein. As such, intermediate portion 128 of quantum layer 122 may substantially cover and/or be disposed directly over angled section 142 of oxide layer 104. Additionally, in the non-limiting example, angled surface 130 of intermediate portion 128 may also correspond to and/or may be substantially parallel to angled section 142 of oxide layer 104. In other non-limiting examples (e.g., oxide layer 104 includes a side wall), intermediate portion 126 may be a stepped (e.g., 90° angle) formed between first portion 124 and second portion 126.

Figure 3:
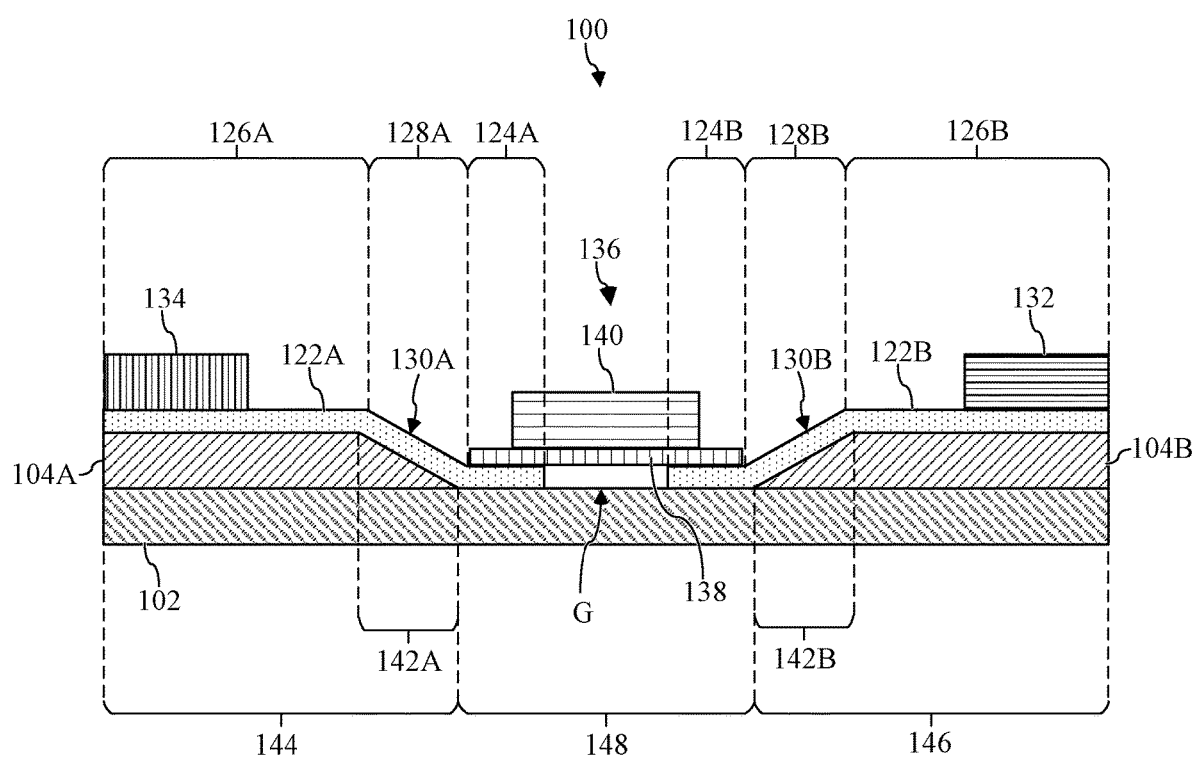
FIG. 3 shows a cross-sectional front view of a field effect transistor including two similar quantum layers, according to embodiments of the disclosure.

FIG. 3 shows another non-limiting example of FET 100. FET 100 shown in FIG. 3 may include two, similar/symmetrical quantum layers 122A, 122B included therein. It is understood that similarly named components and/or similarly numbered components may function in a substantially similar fashion, may include similar materials/components, and/or may include similar interactions with other components. Redundant explanation of these components has been omitted for clarity.

In the non-limiting example shown in FIG. 3, substrate 102 of FET 100 may include a first section 144, a second section 146 distinct from and positioned or formed opposite first section 144, and an intermediate section 148 positioned and/or formed between first section 144 and second section 146. As shown, channel region 136 of FET may be formed and/or positioned above and substantially aligned with intermediate section 148 of substrate 102. First section 144, second section 146, and intermediate section 148 may be integrally formed and/or may each be a distinct portion or section of a single, unitary layer forming substrate 102. That is, distinct sections 144, 146, 148 may be part of the single, unitary layer that is substrate 102 of FET 100.

FET 100, as shown in FIG. 3, may also include a first oxide layer 104A, and a second, distinct oxide layer 104B. First oxide layer 104A, including angled section 142A, may be disposed directly over, positioned on, contact, and/or may substantially cover a portion of first section 144 of substrate 102. Additionally, second oxide layer 104B, including angled section 142B, may be disposed directly over, positioned on, contact, and/or may substantially cover a portion of second section 146 of substrate 102. As shown in FIG. 3, no portion of first oxide layer 104A or second oxide layer 104B may be disposed over intermediate section 148 of substrate 102. Additionally, channel region 136 may be formed adjacent to, substantially between, and/or offset from first oxide layer 104A and second oxide layer 104B, respectively.

In the non-limiting example, first quantum layer 122A may be disposed over first oxide layer 104A and at least a portion of intermediate section 148 of substrate 102, adjacent first oxide layer 104A. More specifically, first portion 124A of first quantum layer 122A may be disposed directly over, positioned on, contact, and/or may substantially cover a portion of intermediate section 148 of substrate 102. Second portion 126A may be formed opposite first portion 124A and may be disposed directly over at least a portion of first oxide layer 104A. In the non-limiting example shown in FIG. 3, second portion 126A of first quantum layer 122A may be disposed directly over, positioned on, contact, and/or may substantially cover the planar portion (e.g., excluding angled section 142A) of first oxide layer 104A. Source region 134 of FET 100 may be disposed directly over, positioned on, contact, and/or may substantially cover second portion 126A of first quantum layer 122A.

Additionally, in the non-limiting example shown in FIG. 3, first quantum layer 122A may also include intermediate portion 128A. Intermediate portion 128A may be formed and/or positioned between first portion 124A and second portion 126A. Similar to the non-limiting example discussed herein with respect to FIG. 1, intermediate portion 128A may include angled, upper surface 130A that may extend between the upper surface of first portion 124A and second portion 126A. Angled surface 130A (and corresponding angled body) of intermediate portion 128A may be formed in FET 100 in order to make first quantum layer 122A a continuous, single, unitary layer that covers first oxide layer 104A and a portion of intermediate section 148 of substrate 102, as discussed herein. As such, intermediate portion 128A of first quantum layer 122A may substantially cover and/or be disposed directly over angled section 142A of first oxide layer 104A. Furthermore, in the non-limiting example, angled surface 130A of intermediate portion 128A may also correspond to and/or may be substantially parallel to angled section 142A of first oxide layer 104A.

Second quantum layer 122B may be disposed over second oxide layer 104B and at least a distinct portion of intermediate section 148 of substrate 102, adjacent second oxide layer 104B. More specifically, first portion 124B of second quantum layer 122B may be disposed directly over, positioned on, contact, and/or may substantially cover a portion of intermediate section 148 of substrate 102. Second portion 126B may be formed opposite first portion 124B and may be disposed directly over at least a portion of second oxide layer 104B. In the non-limiting example shown in FIG. 3, second portion 126B of second quantum layer 122B may be disposed directly over, positioned on, contact, and/or may substantially cover the planar portion (e.g., excluding angled section 142B) of second oxide layer 104B. Drain region 132 of FET 100 may be disposed directly over, positioned on, contact, and/or may substantially cover second portion 126B of second quantum layer 122B.

Additionally, in the non-limiting example shown in FIG. 3, second quantum layer 122B may also include intermediate portion 128B. Intermediate portion 128B may be formed and/or positioned between first portion 124B and second portion 126B. Similar to the non-limiting example discussed herein with respect to FIG. 1, intermediate portion 128B may include angled, upper surface 130B that may extend between the upper surface of first portion 124B and second portion 126B. Angled surface 130B (and corresponding angled body) of intermediate portion 128B may be formed in FET 100 in order to make first quantum layer 122B a continuous, single, unitary layer that covers second oxide layer 104B and a portion of intermediate section 148 of substrate 102, as discussed herein. As such, intermediate portion 128B of second quantum layer 122B may substantially cover and/or be disposed directly over angled section 142B of second oxide layer 104B. Additionally, in the non-limiting example, angled surface 130B of intermediate portion 128B may also correspond to and/or may be substantially parallel to angled section 142B of second oxide layer 104B.

As shown in FIG. 3, channel region 136 may be formed or positioned directly over first portion 124A of first quantum layer 122A, as well as first portion 124B of second quantum layer 122B. For example, insulator layer 138 of channel region 136 may be disposed directly over, positioned on, contact, and/or may substantially cover first portion 124A of first quantum layer 122A and first portion 124B of second quantum layer 122B, respectively. Additionally, as shown in the non-limiting example, first portion 124A of first quantum layer 122A and first portion 124B of second quantum layer 122B may not extend over or completely cover intermediate section 148 of substrate 102, and/or may not contact one another in FET 100. As such, a gap (G) may be formed between first portion 124A of first quantum layer 122A and first portion 124B of second quantum layer 122B. It is understood that gap (G) may be filled with additional material in further processing and/or during the formation of FET 100, as discussed herein.

Figure 4:
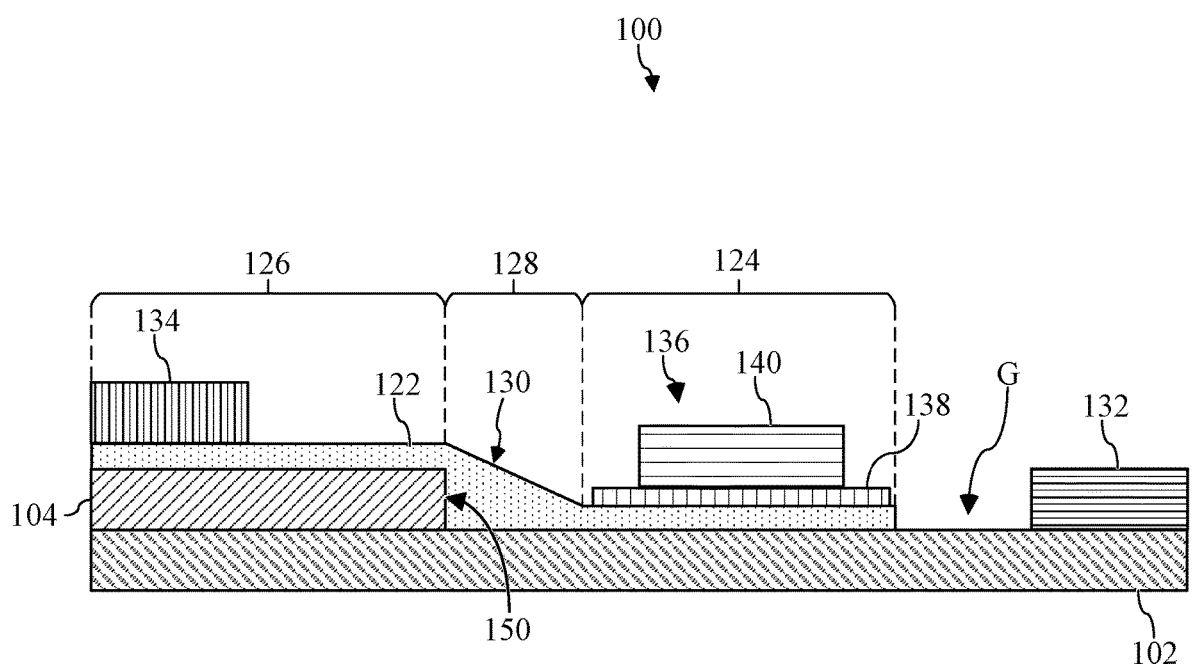
FIG. 4 shows a cross-sectional front view of a field effect transistor including a single quantum layer, according to additional embodiments of the disclosure.
Figure 5:
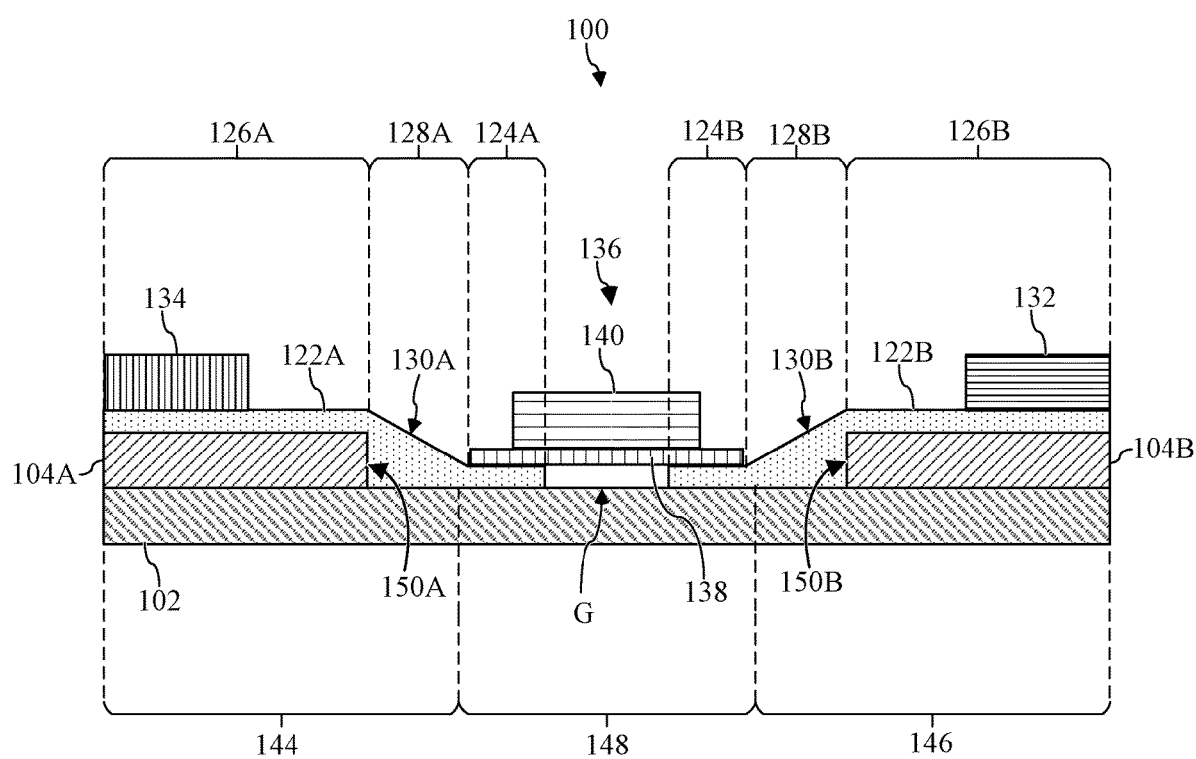
FIG. 5 shows a cross-sectional front view of a field effect transistor including two similar quantum layers, according to further embodiments of the disclosure.

FET 100 may be formed with additional and/or distinct features than those discussed herein. Specifically, FIG. 4 shows another non-limiting example of FET 100 including a single quantum layer 122, and FIG. 5 shows another non-limiting example of FET 100 including two similar quantum layers 122A, 122B. It is understood that similarly named components and/or similarly numbered components may function in a substantially similar fashion, may include similar materials/components, and/or may include similar interactions with other components. Redundant explanation of these components has been omitted for clarity.

By comparison with the non-limiting examples shown in FIGS. 2 and 3, the non-limiting examples of FET 100 shown in FIGS. 4 and 5 may not include angled section 142 (see, FIG. 4) or angled sections 142A, 142B (see, FIG. 5). More specifically, and distinct from FET 100 shown in FIG. 2, oxide layer 104 of FET 100 shown in FIG. 4 may include side wall 150 instead of angled section 142 (see, FIG. 2). Furthermore, first oxide layer 104A and second oxide layer 104B of FET 100 shown in FIG. 5 may include respective side walls 150A, 150B instead of angled sections 142A, 142B (see, FIG. 3). Side walls 150, 150A, 150B may be formed, positioned, and/or oriented substantially perpendicular to a top surface of substrate 102. In the non-limiting examples, quantum layer 122, and more specifically intermediate portion 128 of quantum layer 122, may contact, be disposed directly over, positioned on, and/or substantially cover end wall 150 of oxide layer 104 of FET 100 shown in FIG. 4. Additionally, intermediate portion 128A of first quantum layer 122A, may contact, be disposed directly over, positioned on, and/or substantially cover end wall 150A of first oxide layer 104A of FET 100, and intermediate portion 128B of second quantum layer 122B, may contact, be disposed directly over, positioned on, and/or substantially cover end wall 150B of second oxide layer 104B, as shown in FIG. 5.

Regarding the non-limiting examples discussed with respect to FIGS. 1-5, features or layers of FET 100 may be manufactured or formed therein using any suitable manufacturing methods, processes, or techniques. That is, and as discussed herein, some suitable processes or techniques may include, but are not limited to, material growing/growth, material deposition, chemical-mechanical polishing (CMP), implantation, bonding, annealing, etching, masking, photolithography, metal organic chemical vapor deposition (MOCVD), electronbeam (E-beam) evaporation, and so on.

FIGS. 6-12 show cross-sectional front views of the formation of a field effect transistor (FET). More specifically, FIGS. 6-12 show cross-sectional front views of the formation of a FET including two distinct quantum layers. It is understood that similarly named components and/or similarly numbered components may function in a substantially similar fashion, may include similar materials/components, and/or may include similar interactions with other components. Redundant explanation of these components has been omitted for clarity.

Figure 6:
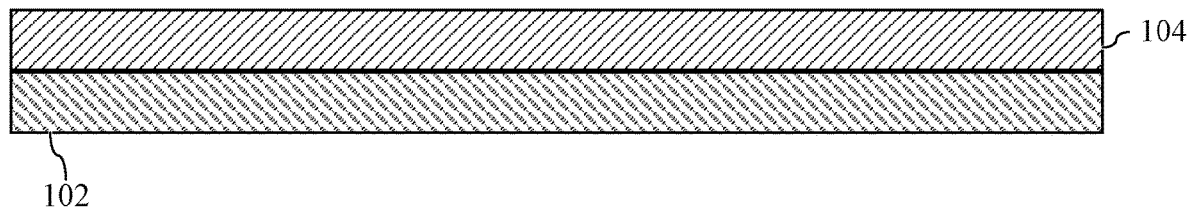
FIGS. 6-12 show cross-sectional front views of a field effect transistor including two distinct quantum layers undergoing build processes, according to embodiments of the disclosure.

FIG. 6 shows a cross-sectional front view of oxide layer 104 formed over substrate 102. In the non-limiting example, oxide layer 104 may be disposed, deposited, and/or grown directly over substrate 102. As shown, oxide layer 04 may substantially cover substrate 102.

Figure 7:
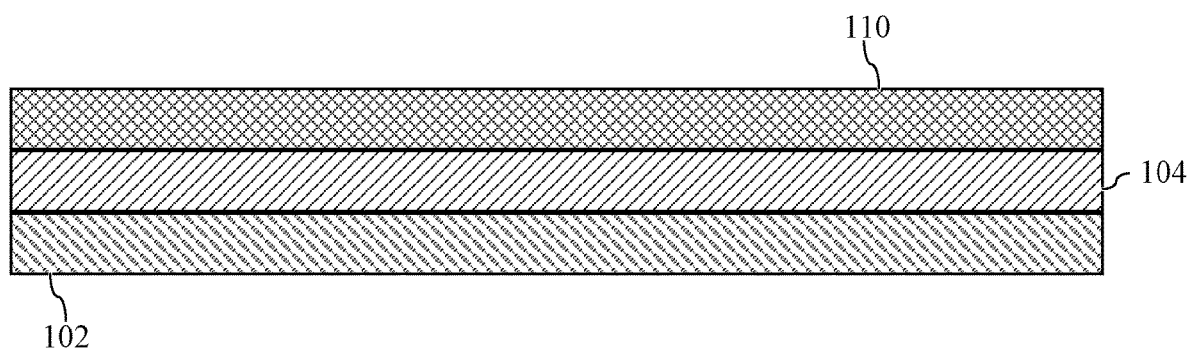

FIG. 7 shows first quantum layer 110 formed over oxide layer 104. In a non-limiting example, first quantum layer 110 may be disposed, deposited over, and/or grown on oxide layer 104. In another non-limiting example, first quantum layer 110 may be formed or grown separate from oxide layer 104/substrate 102 and may subsequently be formed, disposed over, and/or joined with oxide layer 104. As shown, first quantum layer 110 may initially be formed completely over and/or may substantially cover oxide layer 104. In other non-limiting examples discussed herein, first quantum layer 110 formed separate from oxide layer 104 may be formed to size, dimension, and/or may include features (e.g., end wall 112) prior to being joined with oxide layer 104.

Figure 8:
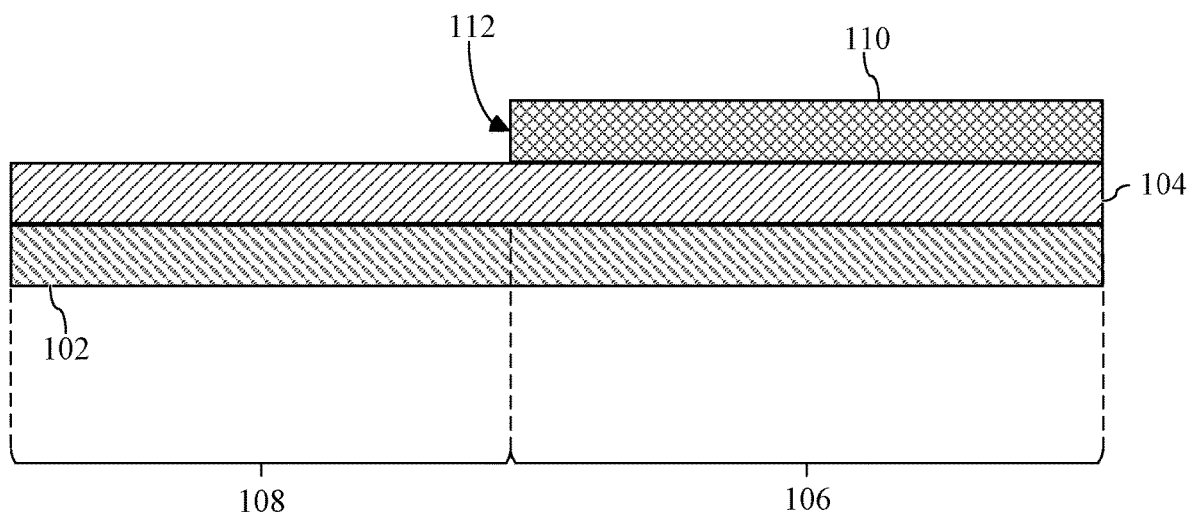

FIG. 8 shows first quantum layer 110 undergoing material removal processes. In the non-limiting example, a portion of first quantum layer 110 may be removed from oxide layer 104. That is, first quantum layer 110 extending, formed, and/or disposed over second section 108 of oxide layer 104 may be removed. As a result, first quantum layer 110 may only extend over first section 106 of oxide layer 104. The portion of first quantum layer 110 removed from and subsequently exposing second section 108 of oxide layer 104 may be removed using any suitable material removal process. For example, the portion of first quantum layer 110 may be removed using any suitable polishing, etching, and/or masking process or technique. The removal of a portion of first quantum layer 110 to expose second section 108 of oxide layer 104 may also result in the formation of end wall 112 in first quantum layer 110. In another non-limiting example where first quantum layer 110 is formed separate from oxide layer 104 and subsequently joined, first quantum layer 110 may be formed to size/dimension and joined to oxide layer 104 to only cover and/or be disposed over first section 106. Additionally in this non-limiting example, first quantum layer 110 may also be joined with oxide layer 104 and may include end wall 112 prior to joining.

Figure 9:
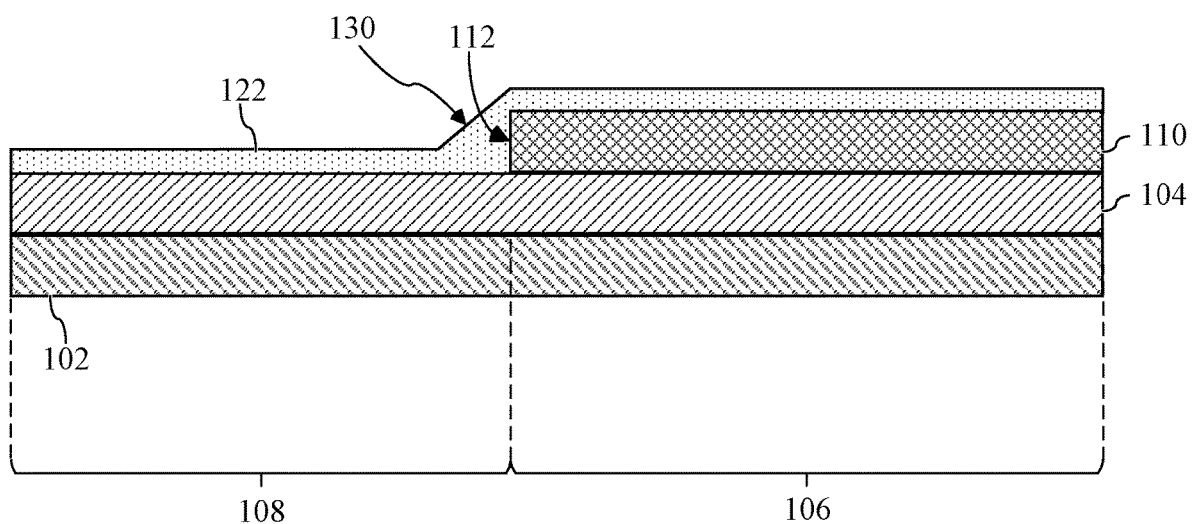

FIG. 9 shows the formation of second quantum layer 122. More specifically, second quantum layer 122 may be formed disposed, deposited over, and/or grown on first quantum layer 110 disposed over first section 106 of oxide layer 104, as well as being formed disposed, deposited over, and/or grown on second section 108 of oxide layer 104. As shown, second quantum layer 122 may initially be formed completely over and/or may substantially cover both second section 108 of oxide layer 104 and first quantum layer 110. Additionally, second quantum layer 122 may substantially cover end wall 112 of first quantum layer 110. As a result of the "step" or level change between first quantum layer 110 and oxide layer 104, forming second quantum layer 122 over first quantum layer 110 and oxide layer 104 may include forming angled surface 130 in second quantum layer 122. As discussed herein, angled surface 130 of second quantum layer 122 may result in the formation of a continuous, single, unitary layer that covers at least a portion of oxide layer 104 and first quantum layer 110. In other non-limiting examples discussed herein, and similar to first quantum layer 110, second quantum layer 122 may alternatively be formed or grown separate from first quantum layer 110/oxide layer 104/substrate 102 and may subsequently be formed, disposed over, and/or joined with second section 108 of oxide layer 104 and first quantum layer 110, respectively. In this example, and as discussed herein, second quantum layer 122 formed separate from first quantum layer 110/oxide layer 104 may be formed to size, dimension, and/or may include features (e.g., angled surface 130) prior to being joined with second section 108 of oxide layer 104 and first quantum layer 110.

Figure 10:
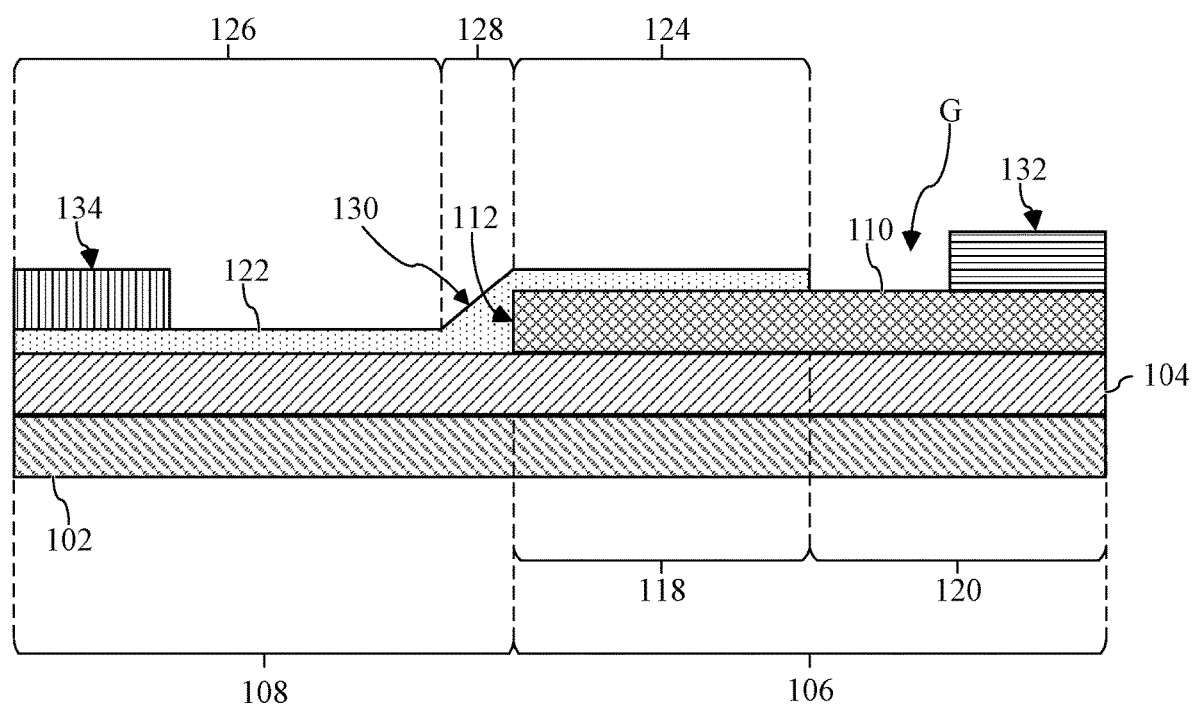

FIG. 10 shows second quantum layer 122 undergoing material removal processes. In the non-limiting example, a portion of second quantum layer 122 may be removed from first quantum layer 110. That is, a portion of second quantum layer 122 extending, formed, and/or disposed over first quantum layer 110 may be removed. As a result, a portion 124 of second quantum layer 122 may only extend over a first segment 118 of first quantum layer 110. Second portion 126 and intermediate portion 128, including angled surface 130, of second quantum layer 122 may not be removed and/or may remain disposed over and/or covering second section 108 of oxide layer 104 and/or end wall 112 of first quantum layer 110, as similarly discussed herein. The portion of second quantum layer 122 removed from and subsequently exposing second segment 120 of first quantum layer 110 may be removed using any suitable material removal process. For example, the portion of second quantum layer 122 may be removed using any suitable polishing, etching, and/or masking process or technique. In another non-limiting example where second quantum layer 122 is formed separate from oxide layer 104/first quantum layer 110 and subsequently joined, second quantum layer 122 may be formed to size/dimension and joined to oxide layer 104/first quantum layer 110 to only cover and/or be disposed over second section 108 of oxide layer 104 and first segment 118 of first quantum layer 110 (including end wall 112). Additionally in this non-limiting example, second quantum layer 122 may also include angled surface 130 prior to joining.

FIG. 10 also shows the formation of drain region 132 and source region 134. As shown, drain region 132 may be formed over first quantum layer 110, while source region 134 may be formed over second quantum layer 122. More specifically, drain region 132 may be formed, deposited, grown, and/or disposed over a portion of second segment 120 of first quantum layer 110, and source region 134 may be formed, deposited, grown, and/or disposed over a portion of second portion 126 of second quantum layer 122. In one non-limiting example, the material forming each of drain region 132 and source region 134 may be disposed over, and subsequently formed or shaped by undergoing material removal processes individually and/or during different processes. In another non-limiting example, a single material may be disposed over the entirety of second quantum layer 122 and second segment 120 of first quantum layer 110, and subsequently processed (e.g., material removal) to form and/or define drain region 132 and source region 134. Drain region 132 and source region 134 may be formed/deposited and subsequently removed from FET 100 (see, FIG. 12) using any suitable material deposition and/or removal process. For example, the removal of excess material to form distinct drain 132 and source region 134 may be any suitable polishing, etching, and/or masking process or technique. Additionally as shown, forming drain region 132 over a portion of second segment 120 of first quantum layer 110 may result in the formation of a gap (G) between first quantum layer 110 and drain region 132.

Figure 11:
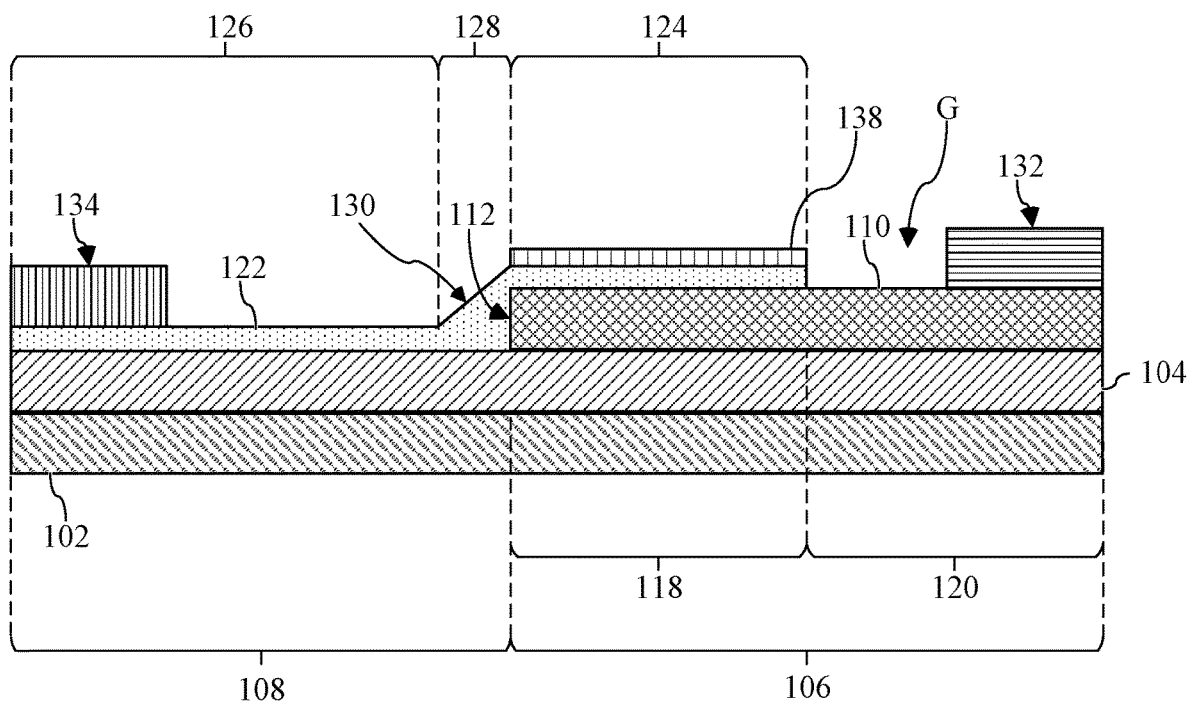

FIG. 11 shows the formation of insulator layer 138. Insulator layer 138 may be formed over a portion of second quantum layer 122. More specifically, and as shown in FIG. 11, insulator layer 138 may be disposed, deposited, formed, and/or grown over first portion 124 of second quantum layer 122 that may substantially cover first segment 118 of first quantum layer 110. In a non-limiting example, insulator layer 138 may be deposited over second quantum layer 122 and first quantum layer 110 forming the gap (G) using any suitable material deposition/formation process. In the non-limiting example, insulator layer 138 may subsequently undergo a material removal process to remove the portions of deposited insulator layer 138 that is not formed over first portion 124 of second quantum layer 122 that may substantially cover first segment 118 of first quantum layer 110. The removal of excess material forming insulator layer 138 may be achieved by performing any suitable material removal process including, but not limited to, polishing, etching, and/or masking processes or techniques.

Figure 12:
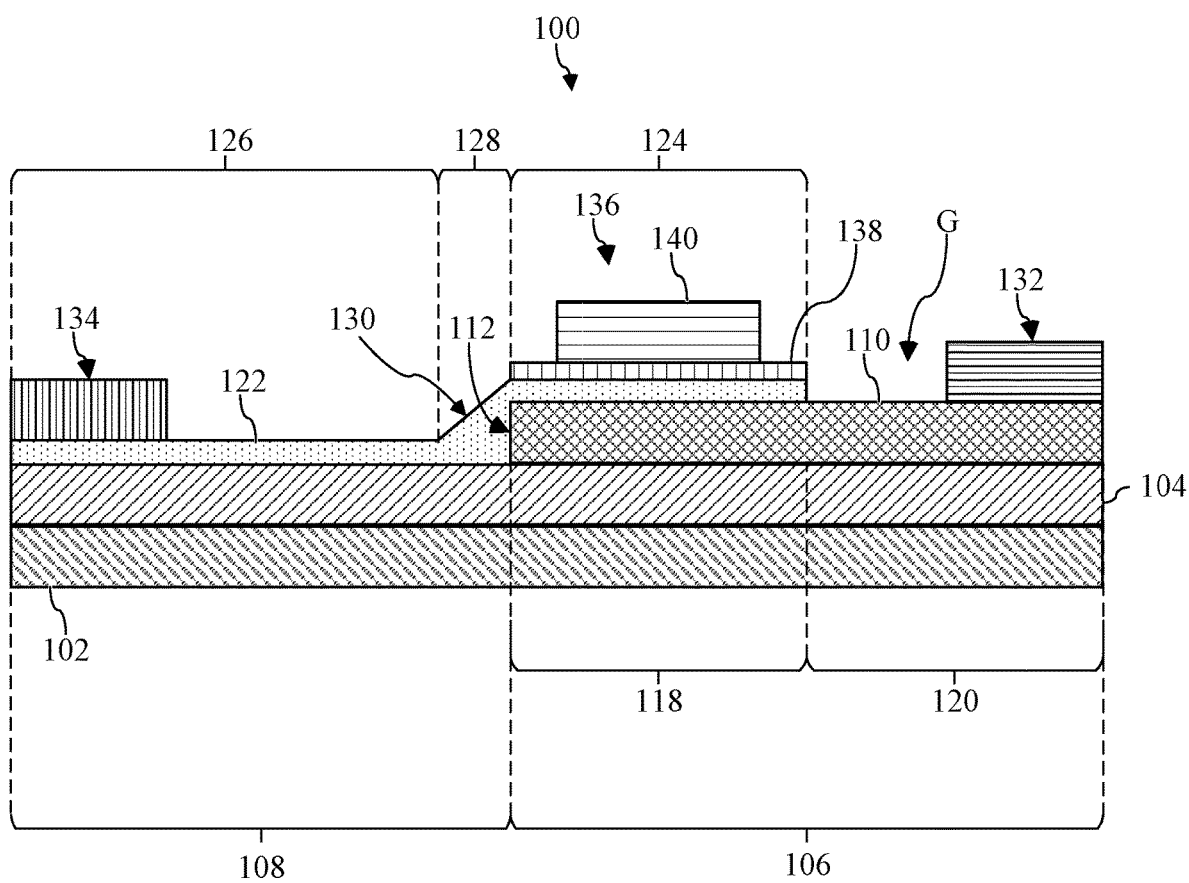

FIG. 12 shows the formation of top gate 140. Top gate 140 may be formed over a portion of insulator layer 138. That is, top gate 140 may be disposed, deposited, formed, and/or grown over a portion of insulator layer 138. In a non-limiting example, top gate 140 may be deposited over insulator layer 138, second portion 126/intermediate portion 128 of second quantum layer 122, and first quantum layer 110 forming the gap (G) using any suitable material deposition/formation process. In the non-limiting example, top gate 140 may subsequently undergo a material removal process to remove the portions of deposited top gate 140 material that is not formed over the desired portion of insulator layer 138. The removal of excess material forming top gate 140 may be achieved by performing any suitable material removal process including, but not limited to, polishing, etching, and/or masking processes or techniques.

FIGS. 13-17 show cross-sectional front views of the formation of another field effect transistor (FET). More specifically, FIGS. 13-17 show cross-sectional front views of the formation of a FET including a single quantum layer. It is understood that similarly named components and/or similarly numbered components may function in a substantially similar fashion, may include similar materials/components, and/or may include similar interactions with other components. Redundant explanation of these components has been omitted for clarity.

Figure 13:
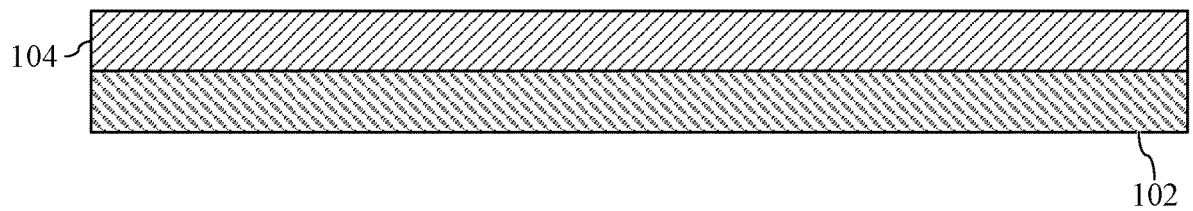
FIGS. 13-17 show cross-sectional front views of a field effect transistor including a single quantum layer undergoing build processes, according to embodiments of the disclosure.

FIG. 13 shows a cross-sectional front view of oxide layer 104 formed over substrate 102. In the non-limiting example, oxide layer 104 may be disposed, deposited, and/or grown directly over substrate 102. As shown, oxide layer 04 may substantially cover substrate 102.

Figure 14:
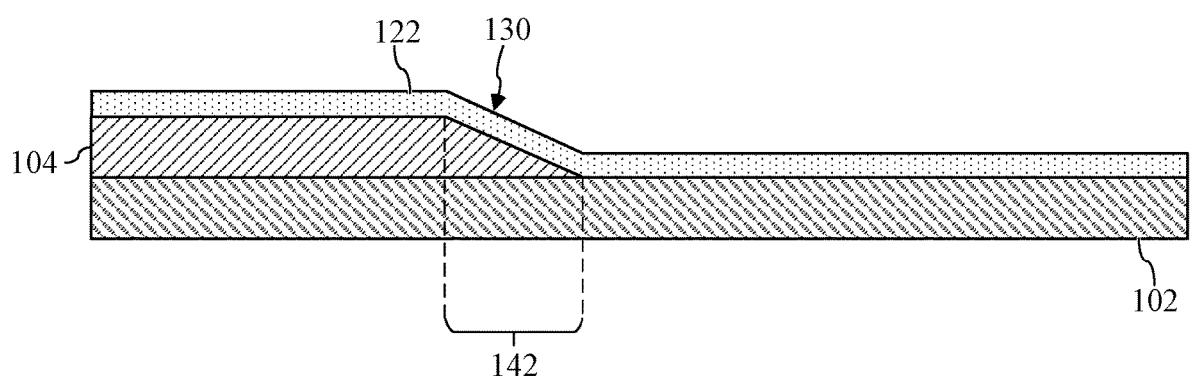

FIG. 14 shows oxide layer 104 undergoing material removal processes. In the non-limiting example, a portion of oxide layer 104 may be removed from substrate 102. As a result, a portion of substrate 102 may be exposed. The portion of oxide layer 104 removed from and subsequently exposing a portion of substrate 102 may be removed using any suitable material removal process. For example, the portion of oxide layer 104 may be removed using any suitable polishing, etching, and/or masking process or technique. The removal of a portion of oxide layer 104 to expose substrate 102 may also result in the formation of angled section 142 in oxide layer 104. In another non-limiting example, oxide layer 104 may not be formed to include angled section 142, but rather may be formed to include side wall 150 (see, FIG. 4).

FIG. 14 also shows the formation of quantum layer 122. More specifically, quantum layer 122 may be formed disposed, deposited over, and/or grown on oxide layer 104 and exposed portion substrate 102. As shown, quantum layer 122 may initially be formed completely over and/or may substantially cover both oxide layer 104 and exposed portion of substrate 102. Additionally, quantum layer 122 may substantially cover angled section 142 of oxide layer 104. As a result of the "step" or level change between oxide layer 104 and substrate 102, forming quantum layer 122 over oxide layer 104/substrate 102 may include forming angled surface 130 in quantum layer 122. As discussed herein, angled surface 130 of quantum layer 122 may result in the formation of a continuous, single, unitary layer that covers oxide layer 104 and a portion of substrate 102. In other non-limiting examples discussed herein, quantum layer 122 may alternatively be formed or grown separate from oxide layer 104/substrate 102 and may subsequently be formed, disposed over, and/or joined with oxide layer 104 and substrate 102, respectively. In this example, and as discussed herein, quantum layer 122 formed separate from substrate 102/oxide layer 104 may be formed to size, dimension, and/or may include features (e.g., angled surface 130) prior to being joined with oxide layer 104 and substrate 102.

Figure 15:
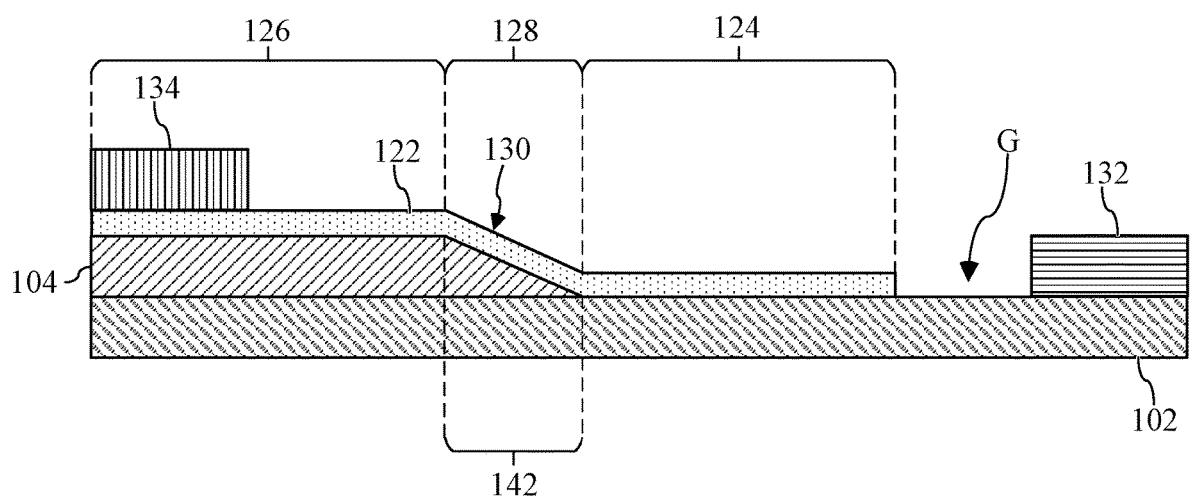

FIG. 15 shows quantum layer 122 undergoing material removal processes. In the non-limiting example, a portion of quantum layer 122 may be removed to expose a portion of substrate 102. That is, a portion of quantum layer 122 extending, formed, and/or disposed over substrate 102 may be removed. As a result, a portion 124 of quantum layer 122 may only extend over substrate 102. Second portion 126 and intermediate portion 128, including angled surface 130, of quantum layer 122 may not be removed and/or may remain disposed over and/or covering oxide layer 104 including angled section 142. The portion of quantum layer 122 removed from and subsequently exposing substrate 102 may be removed using any suitable material removal process. For example, the portion of quantum layer 122 may be removed using any suitable polishing, etching, and/or masking process or technique. In another non-limiting example where quantum layer 122 is formed separate from oxide layer 104/substrate 102 and subsequently joined, quantum layer 122 may be formed to size/dimension and joined to oxide layer 104/substrate 102 to only cover and/or be disposed over the respective portions of oxide layer 104 and substrate 102 as shown in FIG. 15. Additionally in this non-limiting example, quantum layer 122 may also include angled surface 130 prior to joining.

FIG. 15 also shows the formation of drain region 132 and source region 134. As shown, drain region 132 may be formed over substrate 102, while source region 134 may be formed over quantum layer 122. More specifically, drain region 132 may be formed, deposited, grown, and/or disposed over a portion of substrate 102, and source region 134 may be formed, deposited, grown, and/or disposed over a portion of second portion 126 of quantum layer 122. In one non-limiting example, the material forming each of drain region 132 and source region 134 may be disposed over, and subsequently formed or shaped by undergoing material removal processes individually and/or during different processes. In another non-limiting example, a single material may be disposed over the entirety of quantum layer 122 and exposed substrate 102, and subsequently processed (e.g., material removal) to form and/or define drain region 132 and source region 134. Drain region 132 and source region 134 may be formed/deposited and subsequently removed from FET 100 (see, FIG. 17) using any suitable material deposition and/or removal process. For example, the removal of excess material to form distinct drain 132 and source region 134 may be any suitable polishing, etching, and/or masking process or technique. Additionally as shown, forming drain region 132 over a portion of substrate 102 may result in the formation of a gap (G) between quantum layer 122 and drain region 132.

Figure 16:
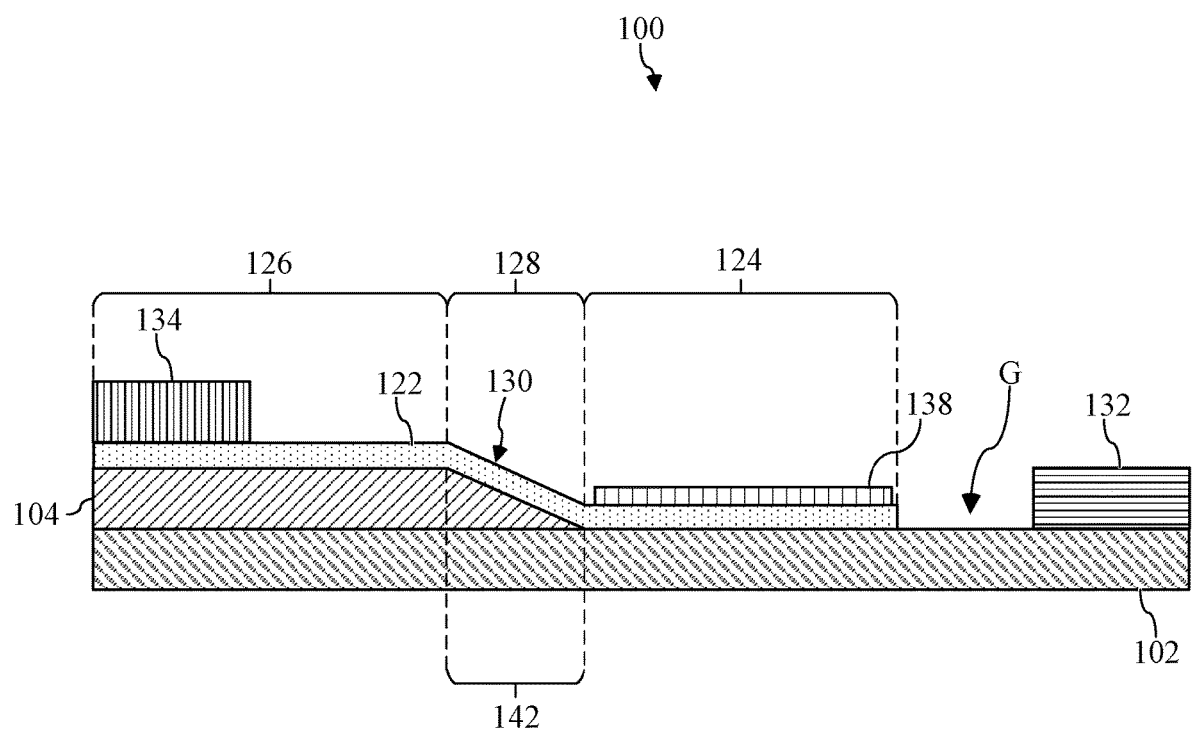

FIG. 16 shows the formation of insulator layer 138. Insulator layer 138 may be formed over a portion of quantum layer 122. More specifically, and as shown in FIG. 16, insulator layer 138 may be disposed, deposited, formed, and/or grown over first portion 124 of quantum layer 122 that may substantially cover a portion of substrate 102. In a non-limiting example, insulator layer 138 may be deposited over quantum layer 122 and substrate 102 forming the gap (G) using any suitable material deposition/formation process. In the non-limiting example, insulator layer 138 may subsequently undergo a material removal process to remove the portions of deposited insulator layer 138 that is not formed over first portion 124 of quantum layer 122 (e.g., substrate 102 forming gap (G)). The removal of excess material forming insulator layer 138 may be achieved by performing any suitable material removal process including, but not limited to, polishing, etching, and/or masking processes or techniques.

Figure 17:
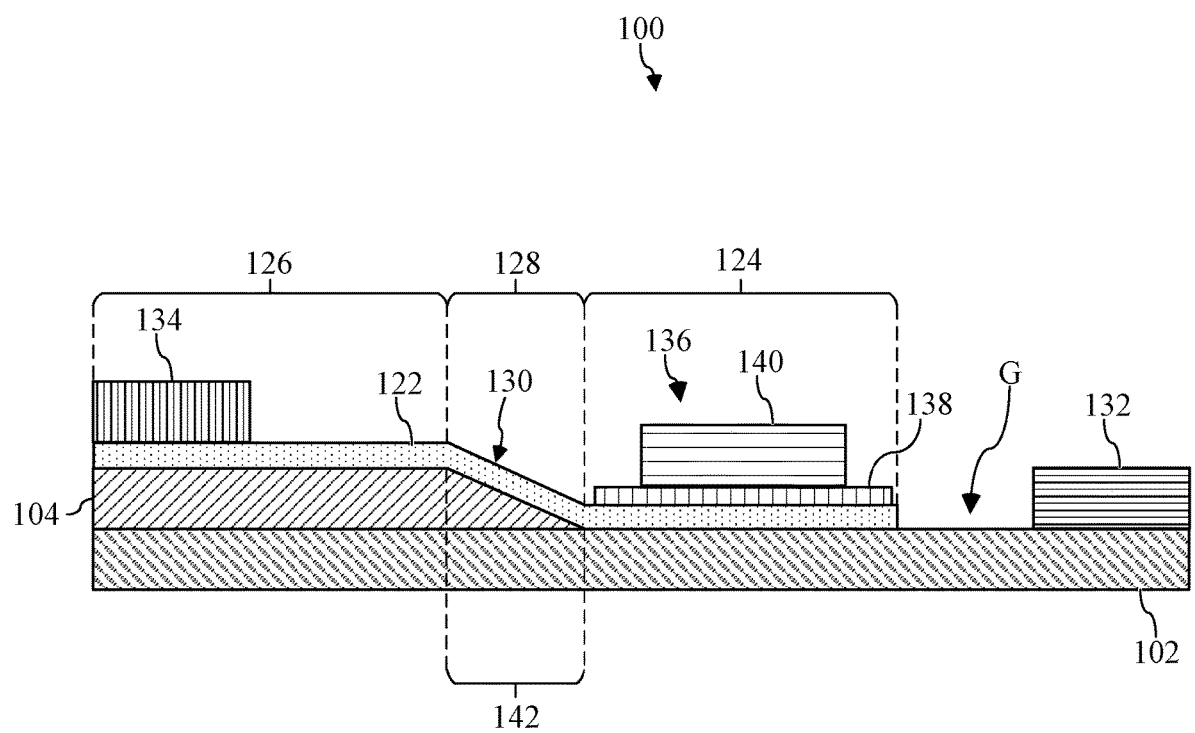

FIG. 17 shows the formation of top gate 140. Top gate 140 may be formed over a portion of insulator layer 138. That is, top gate 140 may be disposed, deposited, formed, and/or grown over a portion of insulator layer 138. In a non-limiting example, top gate 140 may be deposited over insulator layer 138, second portion 126/intermediate portion 128 of quantum layer 122, and substrate 102 forming the gap (G) using any suitable material deposition/formation process. In the non-limiting example, top gate 140 may subsequently undergo a material removal process to remove the portions of deposited top gate 140 material that is not formed over the desired portion of insulator layer 138. The removal of excess material forming top gate 140 may be achieved by performing any suitable material removal process including, but not limited to, polishing, etching, and/or masking processes or techniques.

FIGS. 18-23 show cross-sectional front views of the formation of another field effect transistor (FET). More specifically, FIGS. 18-23 show cross-sectional front views of the formation of a FET including two similar quantum layers. It is understood that similarly named components and/or similarly numbered components may function in a substantially similar fashion, may include similar materials/components, and/or may include similar interactions with other components. Redundant explanation of these components has been omitted for clarity.

Figure 18:
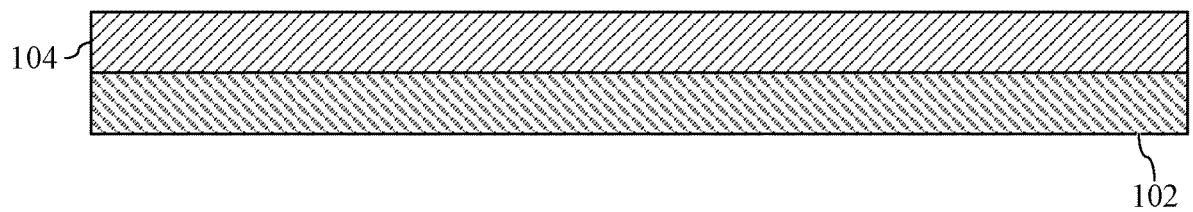
FIG. 18-23 show cross-sectional front views of a field effect transistor including two similar quantum layers undergoing build processes, according to embodiments of the disclosure.

FIG. 18 shows a cross-sectional front view of oxide layer 104 formed over substrate 102. In the non-limiting example, oxide layer 104 may be disposed, deposited, and/or grown directly over substrate 102. As shown, oxide layer 04 may substantially cover substrate 102.

Figure 19:
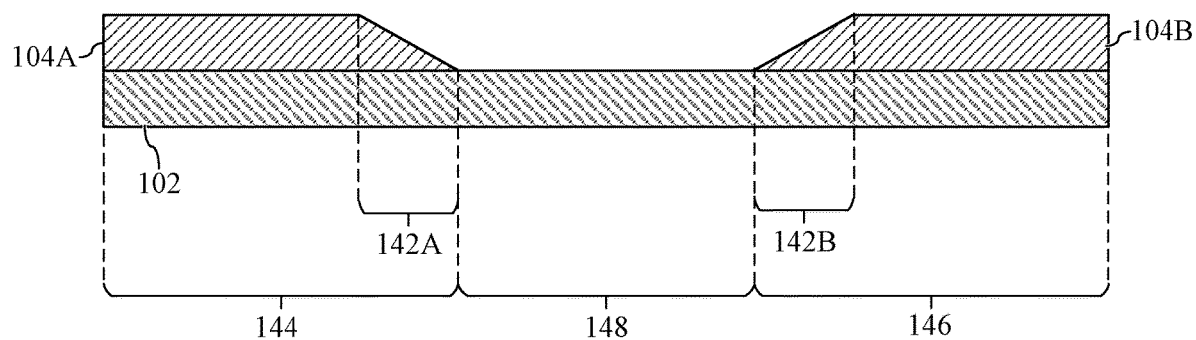

FIG. 19 shows oxide layer 104 undergoing material removal processes. In the non-limiting example, a portion of oxide layer 104 may be removed from substrate 102. As a result, a portion of substrate 102 may be exposed. The portion of oxide layer 104 removed from and subsequently exposing a (central) portion of substrate 102 may be removed using any suitable material removal process. For example, the central portion of oxide layer 104 may be removed using any suitable polishing, etching, and/or masking process or technique. The removal of a portion of oxide layer 104 to expose substrate 102 may result in the formation of first oxide layer 104A and second oxide layer 104B. Additionally, the removal of a portion of oxide layer may result in the formation of angled section 142A in first oxide layer 104A and angled section 142B in second oxide layer 104B. In another non-limiting example, first oxide layer 104A and/or second oxide layer 104B may not be formed to include angled section 142A, 142B, but rather may be formed to include side wall 150A, 150B (see, FIG. 5). As shown in FIG. 19, the removal of a portion of oxide layer 104 to form first oxide layer 104A and second oxide layer 104B may also define a first section 144, second section 146, and third section 148 of substrate 102. First section 144 of substrate 102 may be covered by first oxide layer 104A, second section 146 of substrate may be covered by second oxide layer 104B, and third section 148 of substrate 102 may be exposed.

Figure 20:
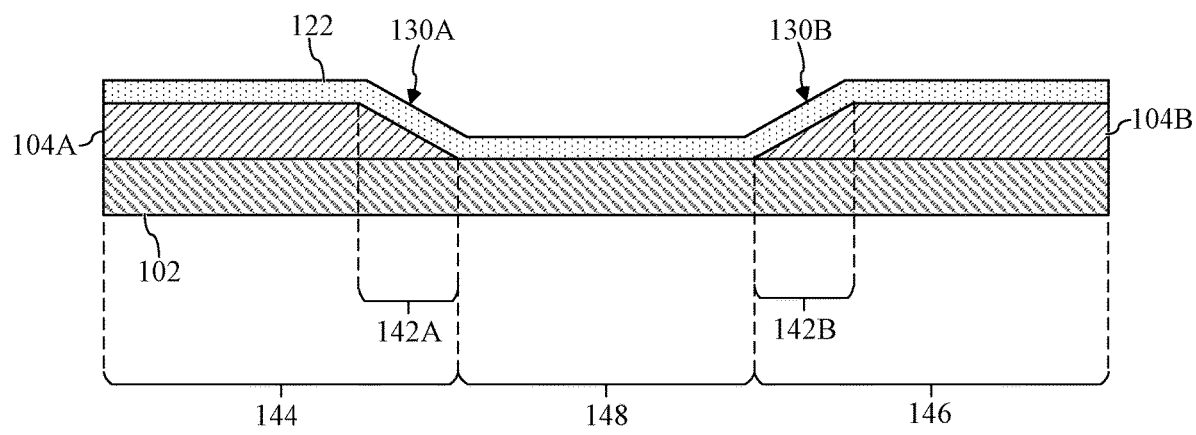

FIG. 20 shows the formation of quantum layer 122. More specifically, quantum layer 122 may be formed disposed, deposited over, and/or grown on first oxide layer 104A and second oxide layer 104B, as well as exposed portion/third section 148 of substrate 102. As shown, quantum layer 122 may initially be formed completely over and/or may substantially cover first oxide layer 104A, second oxide layer 104B, and third section 148 of substrate 102. Additionally, quantum layer 122 may substantially cover angled sections 142A, 142B of first oxide layer 104A and second oxide layer 104B, respectively. As a result of the "step" or level change between first oxide layer 104A/second oxide layer 104B and substrate 102, forming quantum layer 122 over first oxide layer 104A, 104B/substrate 102 may include forming angled surface 130A, 130B in quantum layer 122. As discussed herein, angled surface 130A, 130B of quantum layer 122 may result in the formation of a continuous, single, unitary layer that covers first oxide layer 104A, second oxide layer 104B, and third section 148 of substrate 102. In other non-limiting examples discussed herein, quantum layer 122 may alternatively be formed or grown separate from oxide layer 104A, 104B/substrate 102, and may subsequently be formed, disposed over, and/or joined with oxide layer 104A, 104B and substrate 102, respectively. In this example, and as discussed herein, quantum layer 122 formed separate from substrate 102/oxide layer 104A, 104B may be formed to size, dimension, and/or may include features (e.g., angled surface 130) prior to being joined with oxide layer 104A, 104B and substrate 102.

Figure 21:
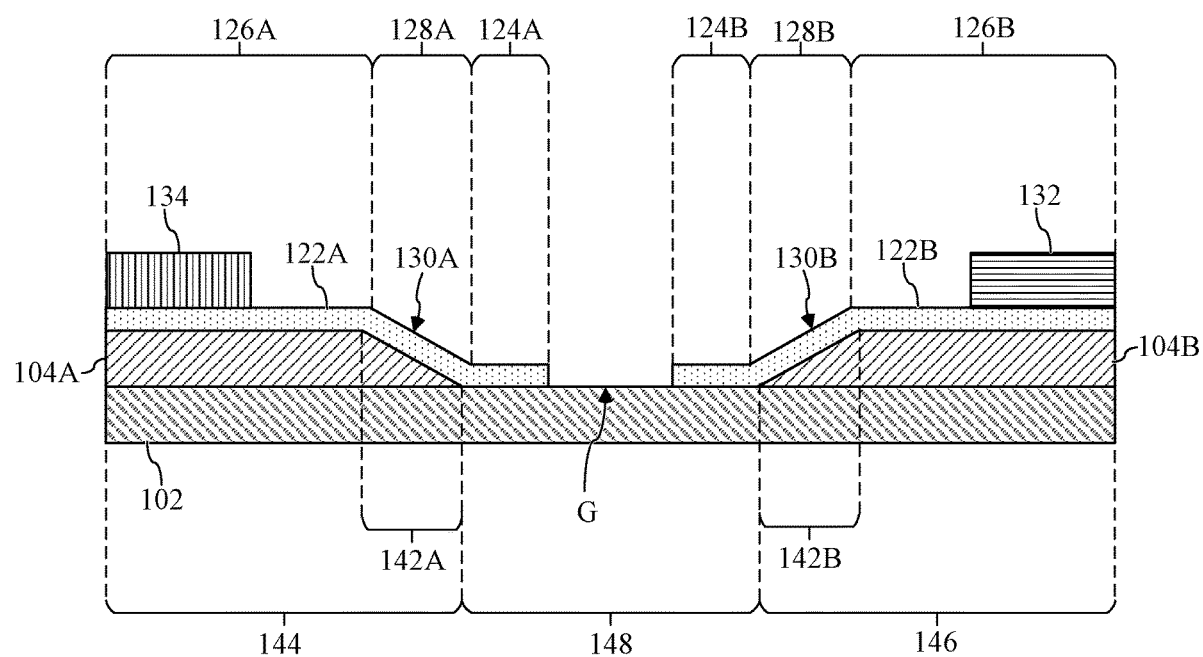

FIG. 21 shows quantum layer 122 undergoing material removal processes. In the non-limiting example, a portion of quantum layer 122 may be removed to expose a portion of substrate 102. That is, a portion of quantum layer 122 extending, formed, and/or disposed directly over third section 148 of substrate 102, between oxide layer 104A, 104B, may be removed. The removal of a portion of quantum layer 122 may form first quantum layer 122A and second quantum layer 122B. As a result, a first portion 124A of first quantum layer 122A may only extend over a portion of third section 148 of substrate 102. Additionally, a second portion 124B of second quantum layer 122B may only extend over a distinct portion of third section 148 of substrate 102. Second portion 126A and intermediate portion 128A, including angled surface 130A, of first quantum layer 122A may not be removed and/or may remain disposed over and/or covering first oxide layer 104A including angled section 142A. Additionally, second portion 126B and intermediate portion 128B, including angled surface 130B, of second quantum layer 122B may not be removed and/or may remain disposed over and/or covering second oxide layer 104B including angled section 142B. The portion of quantum layer 122 removed from and subsequently exposing a portion of third section 148 of substrate 102 may be removed using any suitable material removal process. For example, the portion of quantum layer 122 may be removed using any suitable polishing, etching, and/or masking process or technique. In another non-limiting example where quantum layer 122 is formed separate from oxide layer 104/substrate 102 and subsequently joined, first quantum layer 122A and second quantum layer 122B may be formed to size/dimension and joined to oxide layers 104A, 104B/substrate 102 to only cover and/or be disposed over the respective portions of oxide layers 104A, 104B and substrate 102 as shown in FIG. 21. Additionally in this non-limiting example, quantum layers 122A, 122B may also include angled surfaces 130A, 130B prior to joining. Furthermore, and as shown in FIG. 2, removing a portion of quantum layer 122 to form first quantum layer 122A and second quantum layer 122B may also result in the formation of a gap (G) between first quantum layer 122A and second quantum layer 122B.

FIG. 21 also shows the formation of drain region 132 and source region 134. As shown, drain region 132 may be formed over second quantum layer 122B, while source region 134 may be formed over first quantum layer 122A. More specifically, drain region 132 may be formed, deposited, grown, and/or disposed over a portion of second portion 126B of second quantum layer 122B, and source region 134 may be formed, deposited, grown, and/or disposed over a portion of second portion 126A of first quantum layer 122A. In one non-limiting example, the material forming each of drain region 132 and source region 134 may be disposed over, and subsequently formed or shaped by undergoing material removal processes individually and/or during different processes. In another non-limiting example, a single material may be disposed over the entirety of quantum layers 122A, 122B and exposed substrate 102, and subsequently processed (e.g., material removal) to form and/or define drain region 132 and source region 134. Drain region 132 and source region 134 may be formed/deposited and subsequently removed from FET 100 (see, FIG. 23) using any suitable material deposition and/or removal process. For example, the removal of excess material to form distinct drain 132 and source region 134 may be any suitable polishing, etching, and/or masking process or technique.

Figure 22:
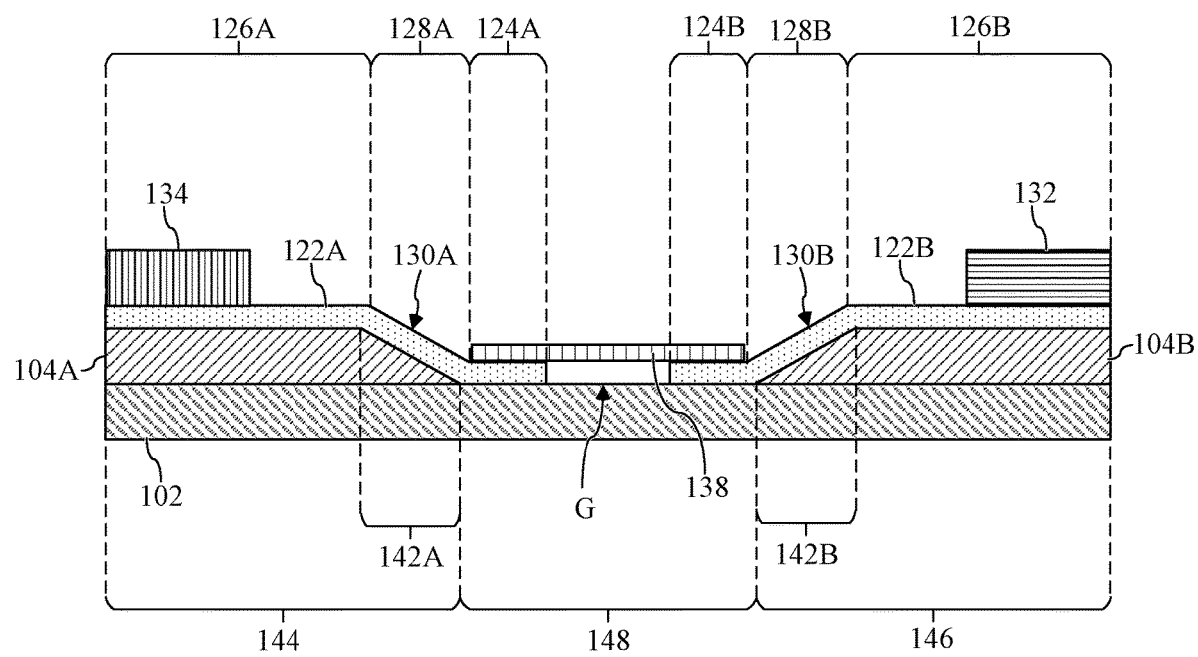

FIG. 22 shows the formation of insulator layer 138. Insulator layer 138 may be formed over a portion of quantum layers 122A, 122B. More specifically, and as shown in FIG. 22, insulator layer 138 may be disposed, deposited, formed, and/or grown over first portion 124A of first quantum layer 122A and first portion 124B of second quantum layer 122B. In a non-limiting example, insulator layer 138 may be deposited over quantum layers 122A, 122B, and may also substantially cover the exposed portion of substrate 102 and/or the gap (G) formed between quantum layers 122A, 122B.

Figure 23:
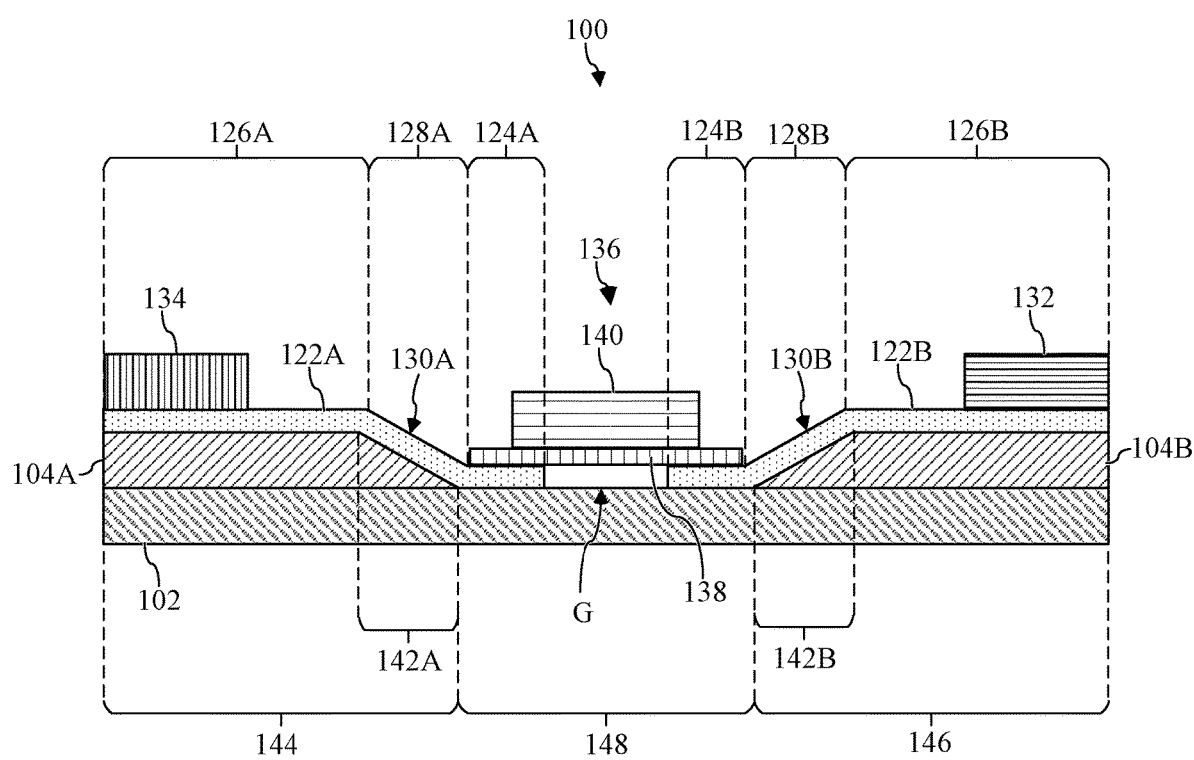

FIG. 23 shows the formation of top gate 140. Top gate 140 may be formed over a portion of insulator layer 138. That is, top gate 140 may be disposed, deposited, formed, and/or grown over a portion of insulator layer 138. In a non-limiting example, top gate 140 may be deposited over insulator layer 138, second portion 126A, 126B/intermediate portion 128A, 128B of quantum layers 122A, 122B, and using any suitable material deposition/formation process. In the non-limiting example, top gate 140 may subsequently undergo a material removal process to remove the portions of deposited top gate 140 material that is not formed over the desired portion of insulator layer 138. The removal of excess material forming top gate 140 may be achieved by performing any suitable material removal process including, but not limited to, polishing, etching, and/or masking processes or techniques.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged; such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A field effect transistor, comprising:
  a substrate;
  an oxide layer disposed at least partially over the substrate;
  a quantum layer disposed over the oxide layer and the substrate, adjacent the oxide layer, the quantum layer further comprising:
    a first portion disposed directly over the substrate;
    a second portion formed opposite the first portion, the second portion disposed directly over the oxide layer; and
    an intermediate portion formed between the first portion and the second portion;
  a drain region disposed directly over the substrate adjacent the quantum layer;
  a source region disposed over the quantum layer, opposite the drain region;
  a channel region formed over the quantum layer, between the drain region and the source region; and
  a gate formed within the channel region, the gate disposed over the quantum layer.

2. The field effect transistor of claim 1, wherein the channel region is formed adjacent and offset from the oxide layer.

3. The field effect transistor of claim 1, wherein the oxide layer includes an angled section extending toward the substrate layer, and
  the intermediate portion includes an angled surface substantially corresponding to the angled section of the oxide layer.

4. The field effect transistor of claim 1, wherein the channel region is disposed directly over the first portion of the quantum layer.

5. The field effect transistor of claim 1, wherein the source region is disposed directly over the second portion of the quantum layer.

6. A field effect transistor, comprising:
  a substrate;
  an oxide layer disposed at least partially over the substrate;

a quantum layer disposed over the oxide layer and the substrate, adjacent the oxide layer, the quantum layer further comprising:
  a first portion disposed directly over the substrate;
  a second portion formed opposite the first portion, the second portion disposed directly over the oxide layer; and
  an intermediate portion formed between the first portion and the second portion;

a drain region disposed directly over the substrate adjacent the quantum layer; a source region disposed over the quantum layer, opposite the drain region; and a channel region formed over the quantum layer, between the drain region and the source region, the channel region formed adjacent and offset from the oxide layer and further including:
  an insulator layer disposed directly over the quantum layer, and
  a top gate formed in the channel region and disposed directly over the insulator layer.

7. The field effect transistor of claim 6, wherein the oxide layer includes an angled section extending toward the substrate layer, and the intermediate portion includes an angled surface substantially corresponding to the angled section of the oxide layer.

8. The field effect transistor of claim 7, wherein the channel region is disposed directly over the first portion of the quantum layer.

9. The field effect transistor of claim 7, wherein the source region is disposed directly over the second portion of the quantum layer.

10. A field effect transistor, comprising:
a substrate;
an oxide layer disposed at least partially over the substrate;
a quantum layer disposed over the oxide layer and the substrate, adjacent the oxide layer;
a drain region disposed directly over the substrate adjacent the quantum layer;
a source region disposed over the quantum layer, opposite the drain region; and a channel region formed over the quantum layer, between the drain region and the source region;
wherein the quantum layer further comprises:
  a first portion disposed directly over the substrate;
  a second portion formed opposite the first portion, the second portion disposed directly over the oxide layer; and
  an intermediate portion formed between the first portion and the second portion; and
wherein the oxide layer includes an angled section extending toward the substrate layer, and the intermediate portion includes an angled surface substantially corresponding to the angled section of the oxide layer.

11. The field effect transistor of claim 10, wherein the channel region is formed adjacent and offset from the oxide layer.

12. The field effect transistor of claim 11, wherein the channel region further comprises:
  an insulator layer disposed directly over the quantum layer; and
  a top gate disposed directly over the insulator layer.

13. The field effect transistor of claim 11, wherein the channel region is disposed directly over the first portion of the quantum layer.

14. The field effect transistor of claim 11, wherein the source region is disposed directly over the second portion of the quantum layer.

* * * * *